United States Patent
Lim

(12) 
(10) Patent No.: US 6,465,371 B2
(45) Date of Patent: Oct. 15, 2002

(54) METHOD FOR MANUFACTURING ZIRCONIUM OXIDE FILM FOR USE IN SEMICONDUCTOR DEVICE

(75) Inventor: Chan Lim, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/884,134

(22) Filed: Jun. 20, 2001

(65) Prior Publication Data

US 2002/0001974 A1 Jan. 3, 2002

(30) Foreign Application Priority Data

Jun. 30, 2000 (KR) .......................... 2000-36789

(51) Int. Cl.[7] .............................................. H01L 21/469

(52) U.S. Cl. ...................... 438/785; 438/778; 438/758

(58) Field of Search ................... 438/765, 778, 438/785, 758

(56) References Cited

PUBLICATIONS

Kukli et al., "Low–temperature deposition of zirconium oxide–based nanocrystalline films by alternate supply of Zr[OC(CH3)3]4 and H2O", Chemical Vapor Deposition, vol. 6, Nov. 2000, pp 297–302.*

Colpo et al., "Zirconia Coatings Deposited by Inductively Coupled Plasma Assisted CVD", Mat. Res. Soc. Symp. Pro. vol. 555, 1999, pp 191–196.*

* cited by examiner

*Primary Examiner*—Trung Dang
(74) *Attorney, Agent, or Firm*—Jacobson Holman PLLC

(57) ABSTRACT

A method for manufacturing a zirconium oxide film for use in a semiconductor device by using an atomic layer deposition (ALD) which begins with setting a wafer in a reaction chamber. Thereafter, a zirconium source material of $Zr(OC(CH_3)_3)_4$ (zirconium tetra-tert-butoxide) is supplied into the reaction chamber and then, an unreacted $Zr(OC(CH_3)_3)_4$ is removed by a $N_2$ purge or a vacuum purge. Subsequently, an oxygen source material is supplied into the reaction chamber, wherein the oxygen source material is selected from the group consisting of vaporized water ($H_2O$), $O_2$ gas, $N_2O$ gas and $O_3$ gas. Finally, an unreacted oxygen source material is purged out from the reaction chamber.

24 Claims, 1 Drawing Sheet

METHOD FOR MANUFACTURING ZIRCONIUM OXIDE FILM FOR USE IN SEMICONDUCTOR DEVICE

FIELD OF THE INVENTION

The present invention relates to a semiconductor device and, more particularly, to a method for manufacturing a zirconium oxide film for use in a semiconductor device by using $Zr(OC(CH_3)_3)_4$ (zirconium tetra-tert-butoxide) as a zirconium oxygen source material in place of conventional $ZrCl_4$.

DESCRIPTION OF THE PRIOR ART

Generally, in a semiconductor memory device, various dielectric materials are used for a gate oxide film and a capacitor thin film so that dielectric properties mainly affect derivability of the semiconductor memory device.

With high integration and high speed of the semiconductor memory device, research has been undertaken for application of a titanium oxide ($TiO_2$) or an aluminum oxide ($Al_2O_3$) as the dielectric material in place of a conventional silicon oxide ($SiO_2$).

A zirconium oxide ($ZrO_2$) film has been applied to the gate oxide film of the semiconductor memory devices with high integration. The zirconium oxide is formed by using an atomic film deposition (ALD) technique. Conventionally, $ZrCl_4$ and vaporized water ($H_2O$) are used as a zirconium source material and an oxygen source material, respectively.

In more detail, a conventional manufacturing method for forming the zirconium oxide film includes the steps of setting a wafer in a reaction chamber; heating the wafer up to a predetermined temperature; supplying the zirconium source material of $ZrCl_4$ into the reaction chamber; purging out unreacted $ZrCl_4$; supplying the oxygen source material of vaporized $H_2O$ to the chamber; and purging out unreacted vaporized $H_2O$. This is one cycle for depositing the zirconium oxide film. By repeating this cycle, the intended thickness of the zirconium oxide film is obtained.

However, since the conventional method utilizes $ZrCl_4$ as the zirconium source material, the zirconium oxide film of the prior art has a disadvantage in that there are chlorines (Cl) remaining in the zirconium oxide film. As a result, an electrical property of the device is degraded and an agglomeration of the zirconium oxide film is apt to occur. In addition, the $ZrCl_4$ is characteristically in a solid state at room temperature and it is melted at a temperature of 437° C. and a pressure of 25 atm. Therefore, it is difficult to supply the $ZrCl_4$ into the reaction chamber in a gaseous state.

SUMMARY OF THE INVENTION

It is, therefore, an object of the present invention to provide a method for manufacturing a zirconium oxide film by 25 using $Zr(OC(CH_3)_3)_4$ (zirconium tetra-tert-butoxide) as a zirconium source material instead of conventional $ZrCl_4$, thereby inhibiting the remainder of chlorine in the zirconium oxide film.

In accordance with one aspect of the present invention, there is provided a method for manufacturing a zirconium oxide film for use in a semiconductor device by using an atomic layer deposition (ALD), the method comprising steps of a) setting a wafer in a reaction chamber; b) supplying a zirconium source material of $Zr(OC(CH_3)_3)_4$ into the reaction chamber; c) purging out unreacted $Zr(OC(CH_3)_3)_4$; d) supplying an oxygen source material into the reaction chamber; and e) purging out unreacted oxygen source material.

In accordance with another aspect of the present invention, there is provided a method for manufacturing a zirconium oxide film for use in a semiconductor device by using an atomic layer deposition (ALD), the method comprising steps of a) setting a wafer in a reaction chamber; b) supplying a zirconium source material of $Zr(OC(CH_3)_3)_4$ into the reaction chamber; c) purging out unreacted $Zr(OC(CH_3)_3)_4$; d) supplying nitrogen species gas into the reaction chamber; and e) purging out unreacted nitrogen species gas.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
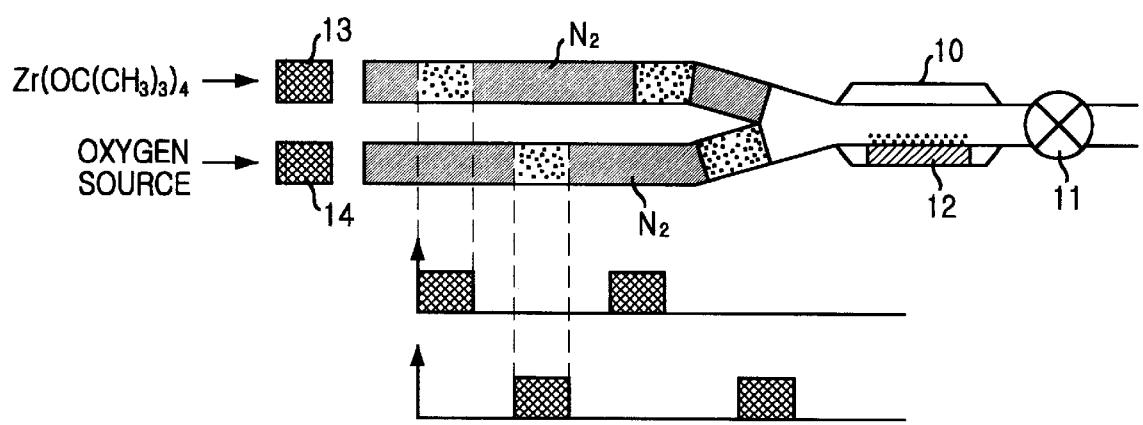
FIG. 1 is a schematic view of an apparatus for forming a zirconium oxide film in accordance with a preferred embodiment of the present invention.

Referring to FIG. 1, there is provided a schematic view of an apparatus for forming a zirconium oxide film in accordance with a preferred embodiment of the present invention. The manufacturing steps begin with setting a wafer 12 in a reaction chamber 10 provided with a discharging pump 11. Thereafter, $Zr(OC(CH_3)_3)_4$ (zirconium tetra-tert-butoxide) is supplied as a zirconium source material into the reaction chamber 10 for a period of approximately 0.1 seconds to approximately 3 seconds while the wafer heats up to a temperature ranging from approximately 250° C. to approximately 450° C. and the $Zr(OC(CH_3)_3)_4$ is absorbed on a surface of the wafer 12.

In a next step, in order to purge out any unreacted $Zr(OC(CH_3)_3)_4$ and a by-product, nitrogen gas ($N_2$) is supplied into the reaction chamber 10 for a period of approximately 0.1 seconds to approximately 5 seconds. Here, a high vacuum purging process may be carried out instead of the $N_2$ purging process.

In a subsequent step, an oxygen source material is supplied into the reaction chamber 10 for a period of approximately 0.1 seconds to approximately 5 seconds, whereby the oxygen source material is absorbed on the surface of the wafer 12. It is preferable that the oxygen source material include vaporized water ($H_2O$), $O_2$ gas, $N_2O$ gas, $O_3$ gas or the like.

Thereafter, in order to purge out any unreacted oxygen source material and a by-product, nitrogen gas ($N_2$) is supplied into the reaction chamber 10 for a period of approximately 0.1 seconds to approximately 5 seconds. Here, the high vacuum purging process may also be carried out instead of the $N_2$ purging process.

This represents one cycle for depositing the zirconium oxide film. By repeating this cycle numerous times, an intended thickness of the zirconium oxide film may be obtained. It is preferable that a pressure in the reaction chamber 10 should be kept within a range of approximately 100 mtorr to approximately 3 Torr. Here, reference numerals 13, 14 denote a vessel for storing the $Zr(OC(CH_3)_3)_4$ and a vessel for storing the oxygen source material, respectively.

Meanwhile, $NH_3$ gas as an active gas can be supplied into the reaction chamber 10 simultaneously, with a flux rate of 20 standard cubic centimeters per minute (sccm) to 1,000 sccm, when the $Zr(OC(CH_3)_3)_4$ is supplied. At this time, separate supply-pipes should be used. If $NH_3$ gas and the $Zr(OC(CH_3)_3)_4$ are supplied into the reaction chamber 10 through the same supply-pipe, the $Zr(OC(CH_3)_3)_4$ reacts with the $NH_3$ gas, thereby producing particles in the supply-pipe.

While supplying the oxygen source material, $NH_3$ gas as the active gas also can be supplied into the reaction chamber 10 simultaneously through the same supply-pipe. If $NH_3$ gas is not supplied into the reaction chamber 10 through the same supply-pipe as used for the oxygen source material, lots of particles may be produced.

$NH_3$ gas may also be supplied simultaneously when the $Zr(OC(CH_3)_3)_4$ and the oxygen source material are supplied into the reaction chamber 10 under the same conditions aforementioned. It is noted that the active gas can be substituted by mixed gas of $H_2$ and $N_2$ instead of $NH_3$ gas.

Finally, after the deposition reaction, carbon (C), hydrogen (H) particles or other impurities may exist in the zirconium oxide film, thereby degrading a resulting electrical property. Thus, the following process is carried out to avoid deterioration of the electrical property using a method such as $O_2$ plasma, $N_2O$ plasma, $UV/O_3$ or the like.

Since the $Zr(OC(CH_3)_3)_4$ has oxygen atoms therein, the zirconium oxide film may be formed without using the oxygen source material such as $H_2O$, $O_2$, $N_2O$ or $O_3$. At this time, $NH_3$ or $H_2+N_2$ gas is supplied into the reaction chamber 10 through the supply-pipe of the oxygen source material. That is, the steps include supplying the $Zr(OC(CH_3)_3)_4$; $N_2$ purging; supplying $NH_3$ gas; $N_2$ purging or vacuum purging. In addition, $NH_3$ gas and the $Zr(OC(CH_3)_3)_4$ can also be supplied into the reaction chamber simultaneously through their respective supply-pipes.

In comparison with the prior art, the inventive method uses the $Zr(OC(CH_3)_3)_4$ as the zirconium source material. As a result, it is possible to inhibit chlorine residues after deposition, thereby preventing degradation of the electrical property and an agglomeration of the zirconium oxide film. Furthermore, the $Zr(OC(CH_3)_3)_4$ has a boiling point of approximately 900° C. so that it is not difficult to supply the $Zr(OC(CH_3)_3)_4$ into the reaction chamber in a gaseous state. In addition, the active gas used in the inventive method, e.g., $NH_3$ or a mixed gas of $H_2$ and $N_2$, reacts with the $Zr(OC(CH_3)_3)_4$, thereby forming a hydrocarbon such as $CH_4$, $CH_3$ or the like. Thus, this active gas accelerates the decomposition of the zirconium or oxygen source material and reduces the concentration of impurities in the zirconium oxide film.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a zirconium oxide film for use in a semiconductor device by using an atomic layer deposition (ALD), the method comprising steps of:
   a) setting a wafer in a reaction chamber;
   b) supplying a zirconium source material of $Zr(OC(CH_3)_3)_4$ (zirconium tetra-tert-butoxide) into the reaction chamber;
   c) purging out unreacted $Zr(OC(CH_3)_3)_4$;
   d) supplying an oxygen source material into the reaction chamber;
   e) purging out unreacted oxygen source material; and
   f) carrying out a process using an oxygen gas plasma selected from the group consisting of UV—$O_3$, $N_2O$, $O_2$ and $O_3$.

2. The method as recited in claim 1, wherein the steps b) to e) are repeated several times until the zirconium oxide film is formed to a predetermined thickness.

3. The method as recited in claim 1, wherein the $Zr(OC(CH_3)_3)_4$ is supplied simultaneously with $NH_3$ gas into the reaction chamber through respective supply-pipes.

4. The method as recited in claim 3, wherein a flux of $NH_3$ gas ranges from approximately 20 sccm to approximately 1,000 sccm.

5. The method as recited in claim 1, wherein the $Zr(OC(CH_3)_3)_4$ and a mixed gas of hydrogen gas ($H_2$) and nitrogen gas ($N_2$) are supplied simultaneously into the reaction chamber through respective supply-pipes.

6. The method as recited in claim 5, wherein a flux of the mixed gas of $H_2$ and $N_2$ ranges from approximately 20 sccm to approximately 1,000 sccm.

7. The method as recited in claim 1, wherein the oxygen source material is supplied simultaneously with $NH_3$ gas into the reaction chamber through a common supply-pipe.

8. The method as recited in claim 7, wherein a flux of $NH_3$ gas ranges from approximately 20 sccm to approximately 1,000 sccm.

9. The method as recited in claim 1, wherein the oxygen source material and a mixed gas of hydrogen gas ($H_2$) and nitrogen gas ($N_2$) are supplied simultaneously into the reaction chamber through a common supply-pipe.

10. The method as recited in claim 9, wherein a flux of the mixed gas of $H_2$ and $N_2$ ranges from approximately 20 sccm to approximately 1,000 sccm.

11. The method as recited in claim 1, wherein the oxygen source material is selected from the group consisting of vaporized water ($H_2O$), $O_2$ gas, $N_2O$ gas and $O_3$ gas.

12. The method as recited in claim 1, wherein the step c) is carried out by using a method selected from the group consisting of a nitrogen gas ($N_2$) purge and a vacuum purge.

13. The method as recited in claim 1, wherein the step e) is carried out by using a method selected from the group consisting of a nitrogen gas ($N_2$) purge and a vacuum purge.

14. The method as recited in claim 1, wherein a temperature of the wafer ranges from approximately 250° C. to approximately 450° C.

15. The method as recited in claim 1, wherein a pressure in the reaction chamber ranges from approximately 100 mTorr to approximately 3 Torr.

16. The method as recited in claim 1, wherein the steps b) and d) are each carried out for a period of approximately 0.1 seconds to approximately 5 seconds.

17. The method as recited in claim 1, wherein the steps c) and e) are each carried out for a period of approximately 0.1 seconds to approximately 5 seconds.

18. A method for manufacturing a zirconium oxide film for use in a semiconductor device by using an atomic layer deposition (ALD), the method comprising steps of:
   a) setting a wafer in a reaction chamber;
   b) supplying a zirconium source material of $Zr(OC(CH_3)_3)_4$ into the reaction chamber;
   c) purging out unreacted $Zr(OC(CH_3)_3)_4$;
   d) supplying nitrogen species gas into the reaction chamber; and
   e) purging out unreacted nitrogen species gas.

19. The method as recited in claim 18, wherein the nitrogen species gas is selected from the group consisting of $NH_3$ gas and a mixed gas of $H_2$ and $N_2$.

20. The method as recited in claim 18, wherein the steps b) to e) are repeated several times until the zirconium oxide film is formed to a predetermined thickness.

21. The method as recited in claim 18, after the step e), further comprising the step of carrying out an oxygen gas plasma selected from the group consisting of UV—$O_3$, $N_2O$, $O_2$ and $O_3$.

22. The method as recited in claim 18, wherein the $Zr(OC(CH_3)_3)_4$ is supplied simultaneously with $NH_3$ gas into the reaction chamber through respective supply-pipes.

23. The method as recited in claim 18, wherein the $Zr(OC(CH_3)_3)_4$ and a mixed gas of $H_2$ and $N_2$ are supplied simultaneously into the reaction chamber through respective supply-pipes.

24. The method as recited in claim 18, wherein the step c) is carried out by using a method selected from the group consisting of a nitrogen gas ($N_2$) purge and a vacuum purge.

* * * * *